(12) United States Patent
Yang et al.

(10) Patent No.: US 12,293,995 B2
(45) Date of Patent: May 6, 2025

(54) APPARATUS AND METHOD FOR COLLECTING SEMICONDUCTOR LIGHT EMITTING DIODES

(71) Applicant: LG ELECTRONICS INC., Seoul (KR)

(72) Inventors: Dohwan Yang, Seoul (KR); Dohee Kim, Seoul (KR); Yongil Shin, Seoul (KR); Bongchu Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 536 days.

(21) Appl. No.: 17/638,163

(22) PCT Filed: Sep. 3, 2019

(86) PCT No.: PCT/KR2019/011283
§ 371 (c)(1),
(2) Date: Feb. 24, 2022

(87) PCT Pub. No.: WO2021/040111
PCT Pub. Date: Mar. 4, 2021

(65) Prior Publication Data
US 2022/0367423 A1    Nov. 17, 2022

(30) Foreign Application Priority Data
Aug. 28, 2019   (KR) .................. 10-2019-0106060

(51) Int. Cl.
*H01L 33/62*  (2010.01)
*H01L 25/075*  (2006.01)
*H01L 33/00*  (2010.01)

(52) U.S. Cl.
CPC ........ *H01L 25/0753* (2013.01); *H01L 33/005* (2013.01); *H01L 33/62* (2013.01); *H01L 2933/0066* (2013.01)

(58) Field of Classification Search
CPC ............ H01L 21/67144; H01L 25/167; H01L 2933/0066; H01L 33/0095; H01L 33/62; H01L 21/7806
See application file for complete search history.

(56) References Cited

U.S. PATENT DOCUMENTS

| 9,755,110 B1 | 9/2017 | Crowder et al. |
| 2017/0133558 A1 | 5/2017 | Sasaki et al. |
| 2018/0102352 A1* | 4/2018 | Sasaki ................. H01L 27/153 |

FOREIGN PATENT DOCUMENTS

| JP | 2008525206 | 7/2008 |
| KR | 1020180030454 | 3/2018 |

(Continued)

OTHER PUBLICATIONS

European Patent Office Application Serial No. 19943515.7, Search Report dated Sep. 27, 2023, 7 pages.

(Continued)

*Primary Examiner* — Jaehwan Oh
(74) *Attorney, Agent, or Firm* — LEE, HONG, DEGERMAN, KANG & WAIMEY

(57) ABSTRACT

A device for collecting semiconductor light emitting diodes according to an embodiment of the present disclosure includes an electromagnet portion disposed in a fluid chamber into which semiconductor light emitting diodes including a magnetic material are put to form a magnetic field when power is applied, a power supply portion connected to the electromagnet portion and applying power to the electromagnet portion, and a driving portion moving the electromagnet portion in a width direction, in a longitudinal direction, and in a height direction of the fluid chamber, in which the electromagnet portion guides the semiconductor light emitting devices to a surface on which a magnetic field is formed when power is applied.

11 Claims, 9 Drawing Sheets

(56) References Cited

FOREIGN PATENT DOCUMENTS

| KR | 1020180130845 | 12/2018 |
|----|---------------|---------|
| KR | 1020190009003 | 1/2019 |
| KR | 1020190096474 | 8/2019 |

OTHER PUBLICATIONS

PCT International Application No. PCT/KR2019/011283, International Search Report dated May 27, 2020, 2 pages.

* cited by examiner

【FIG. 1】
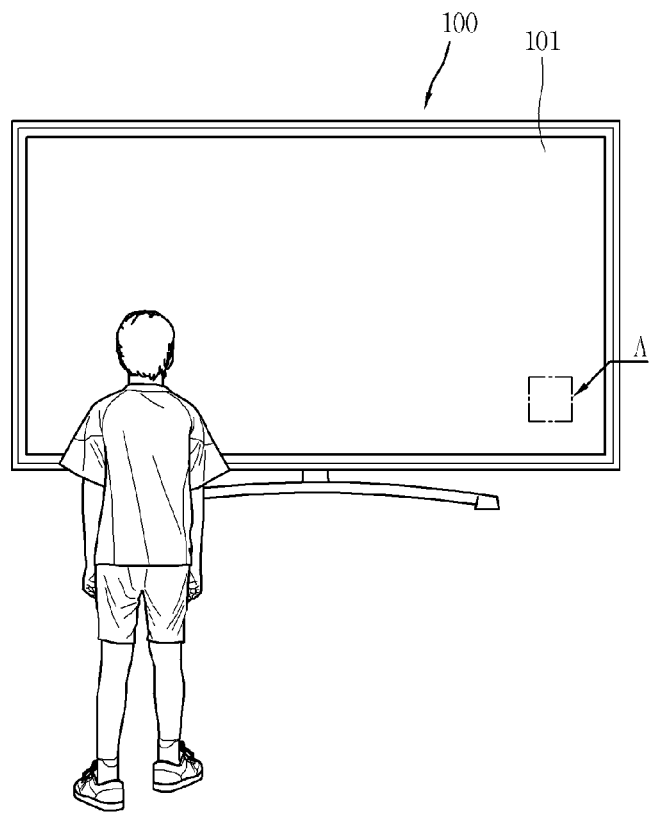
【FIG. 2】
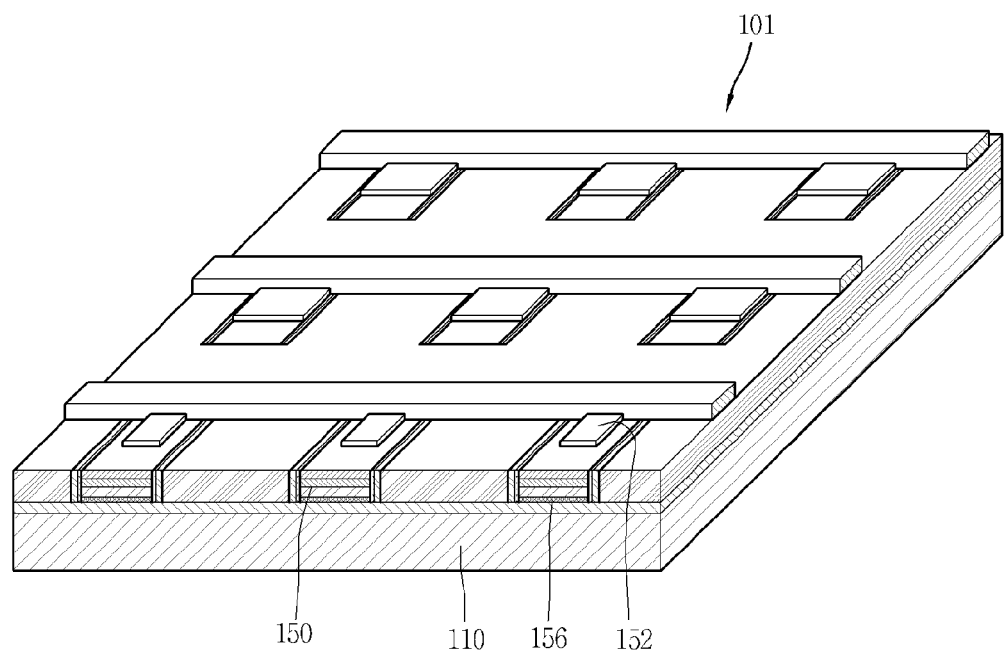

【FIG. 3】
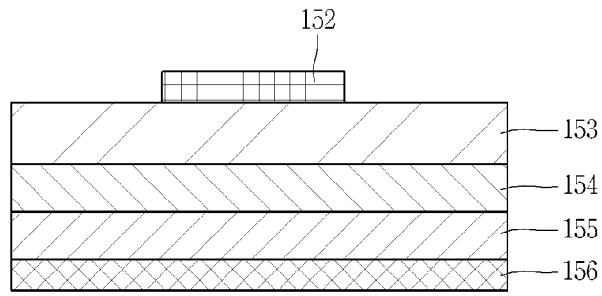
【FIG. 4】
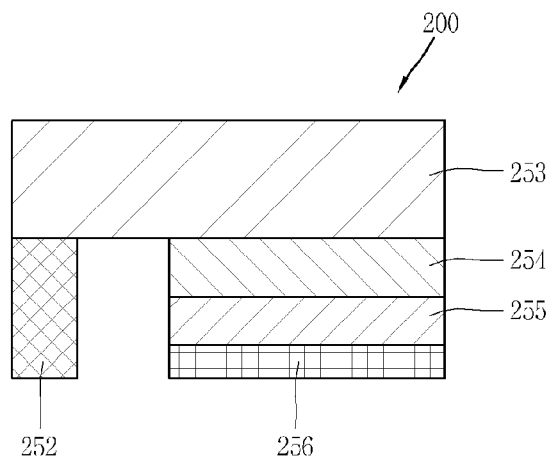
【FIG. 5a】
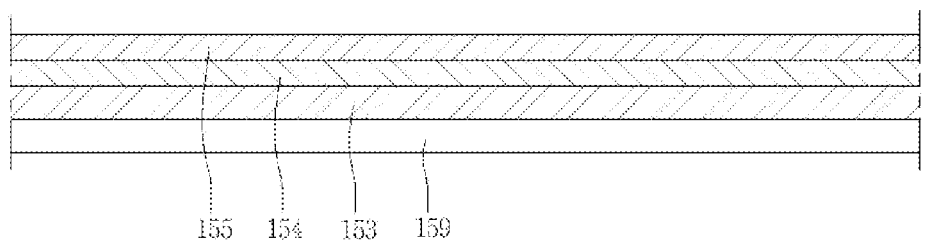
【FIG. 5b】
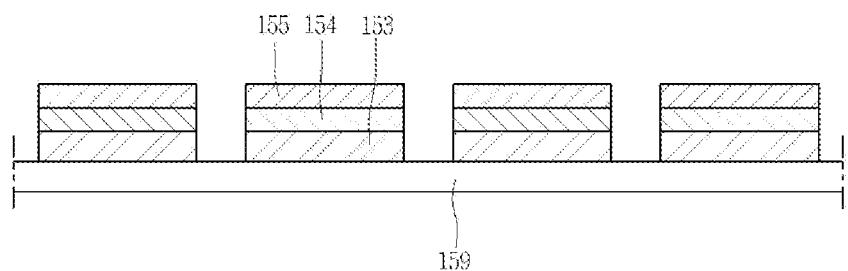

[FIG. 5c]
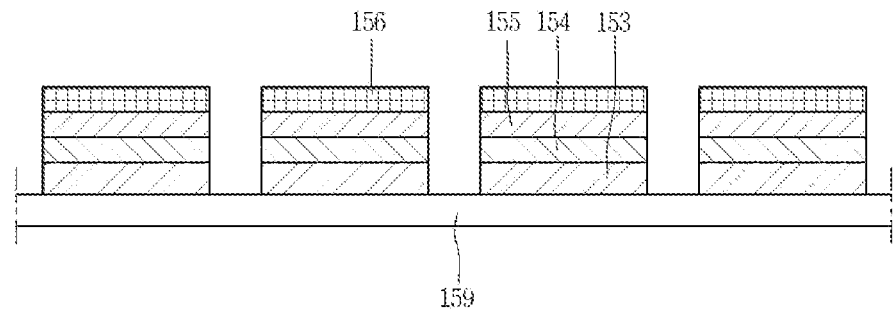
[FIG. 5d]
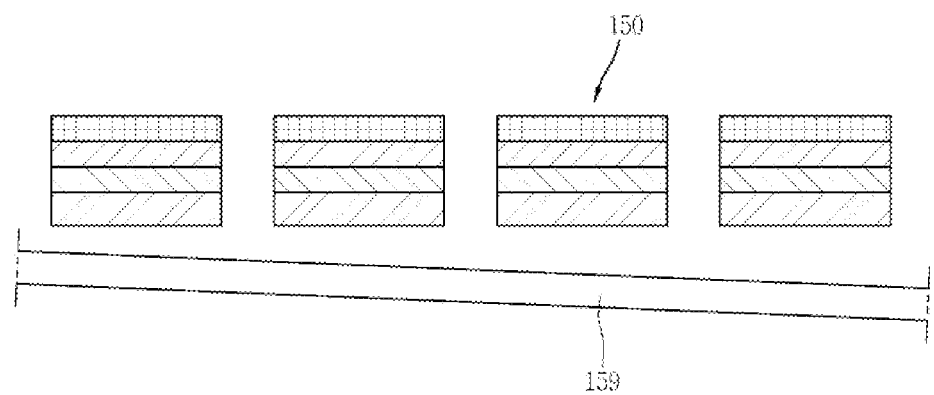
[FIG. 5e]
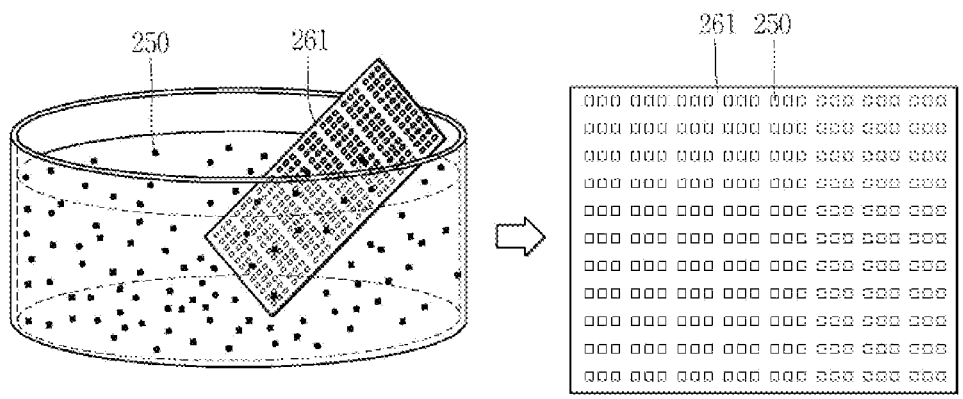

[FIG. 6]
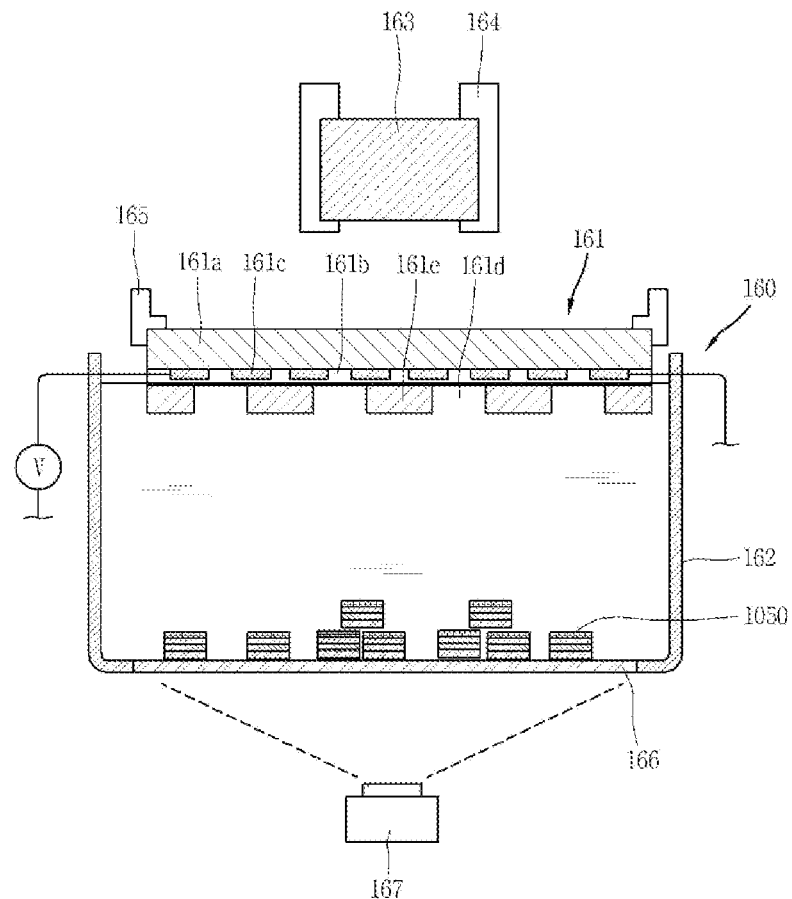
[FIG. 7]
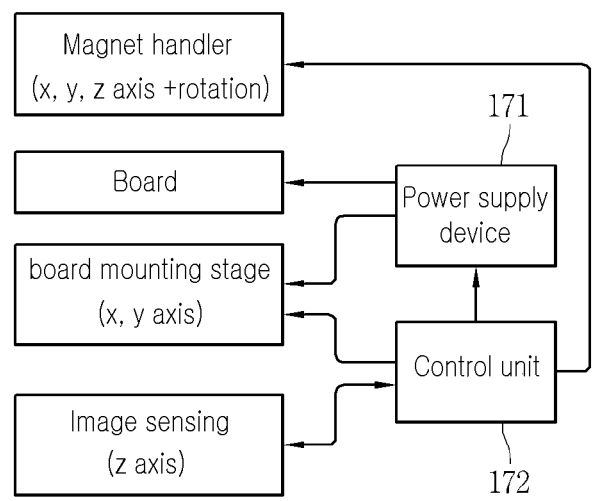

【FIG. 8a】
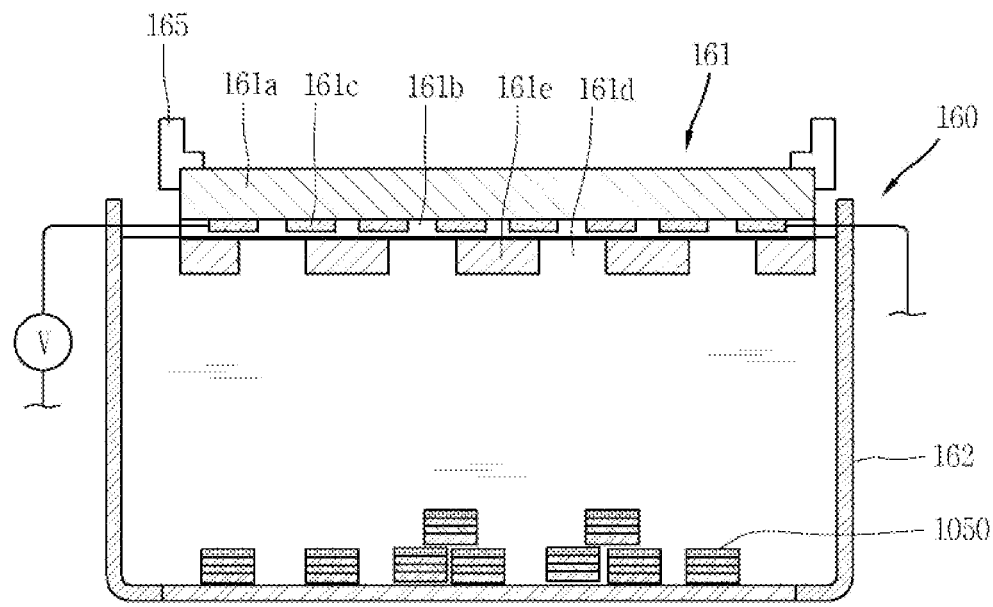
【FIG. 8b】
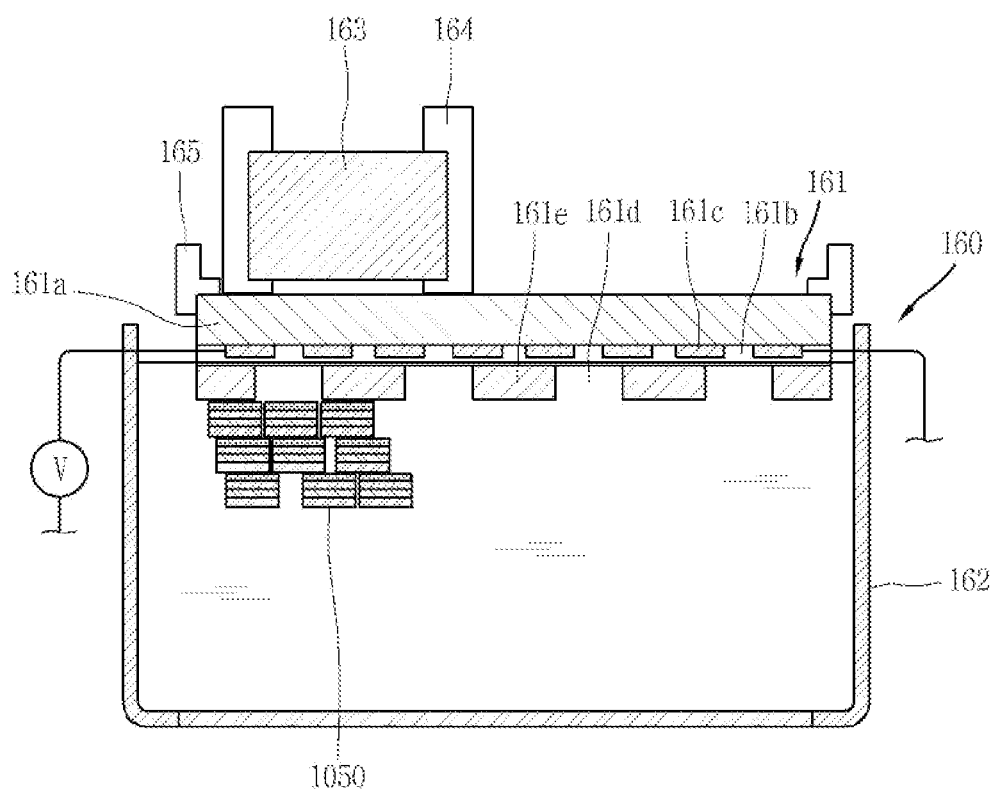

[FIG. 8c]
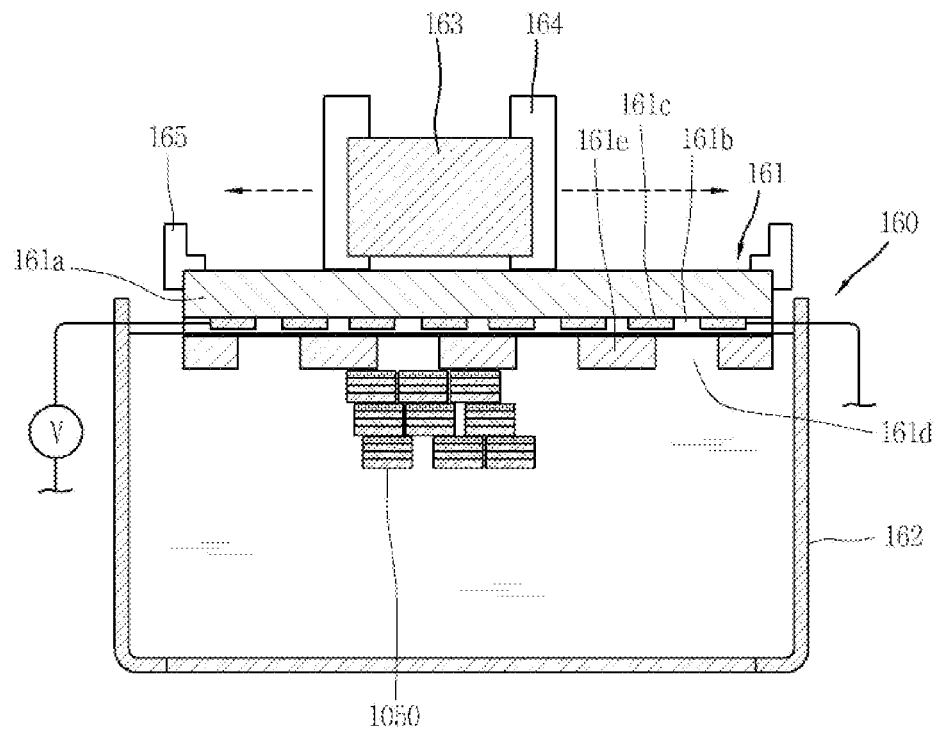
[FIG. 8d]
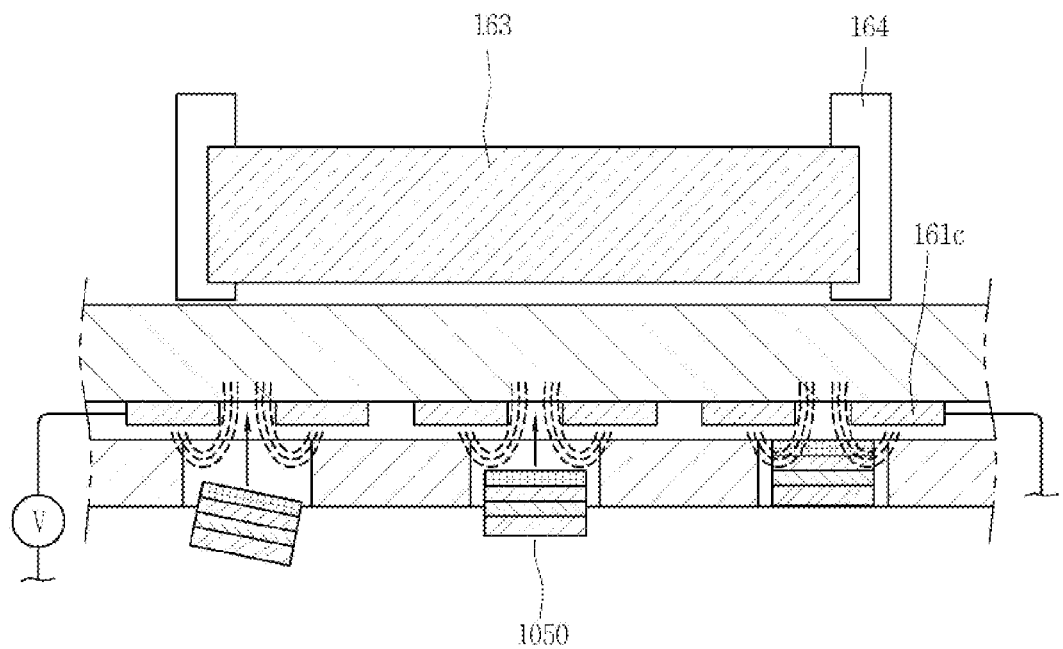

【FIG. 8e】
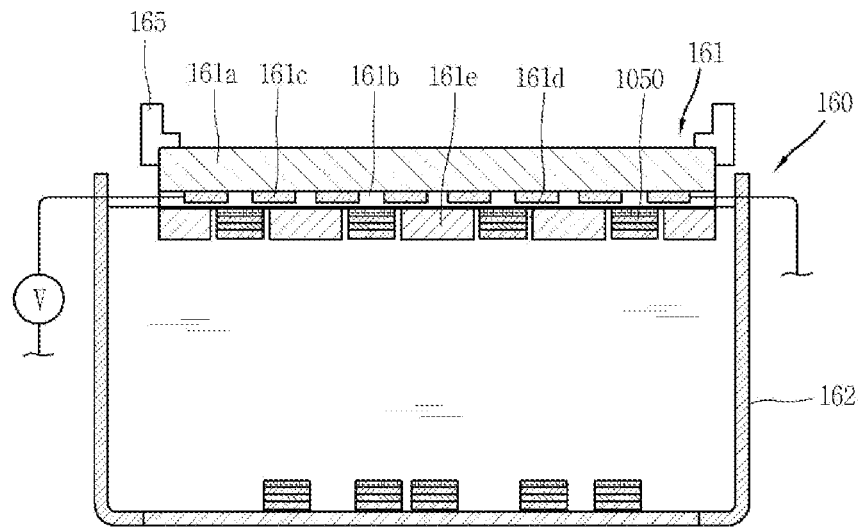
【FIG. 9】
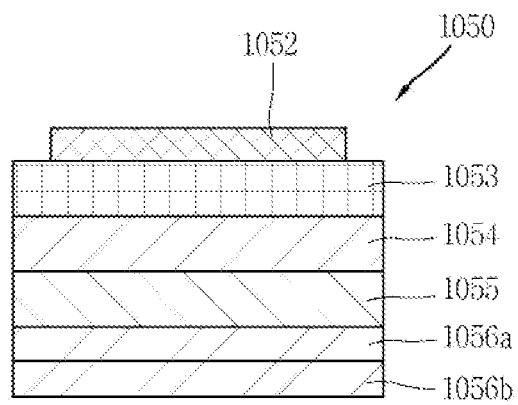
【FIG. 10】
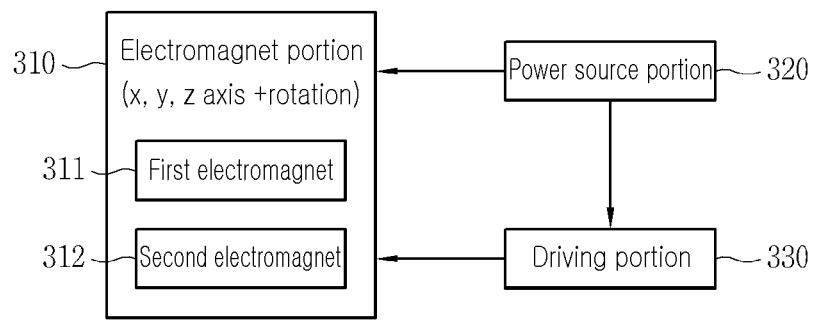

【FIG. 11】
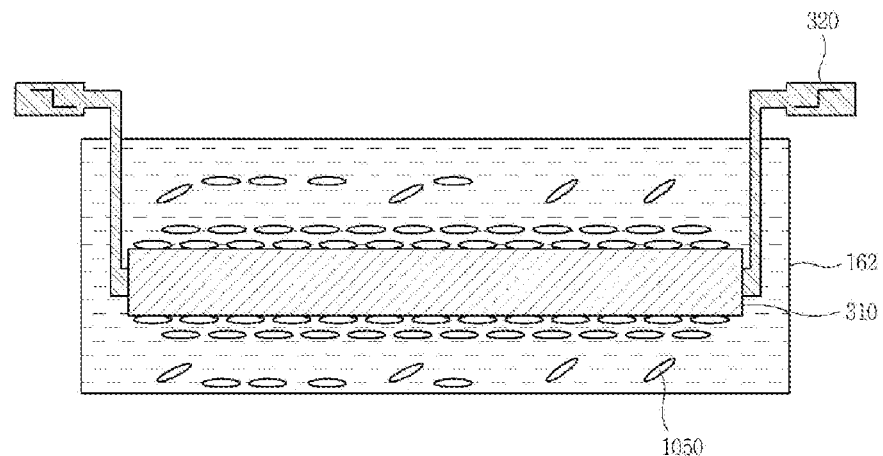
【FIG. 12a】
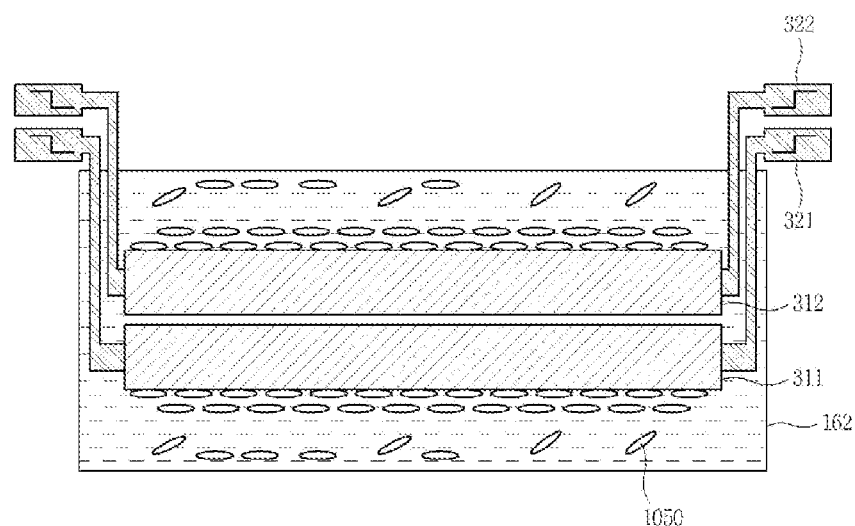
【FIG. 12b】
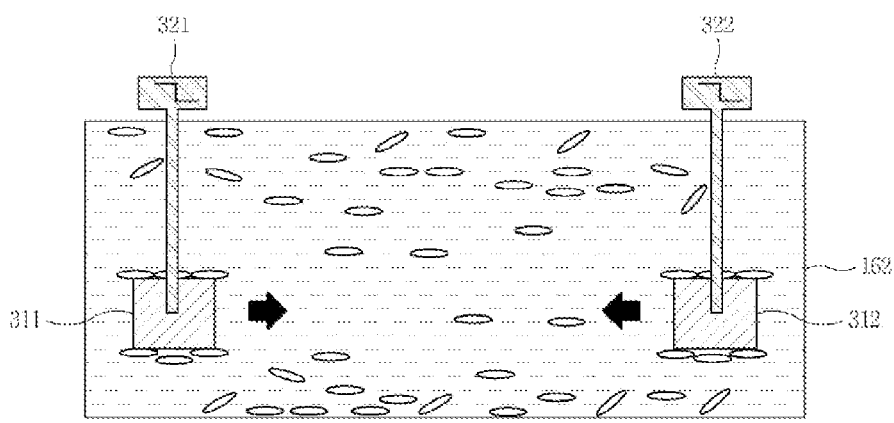

【FIG. 13】
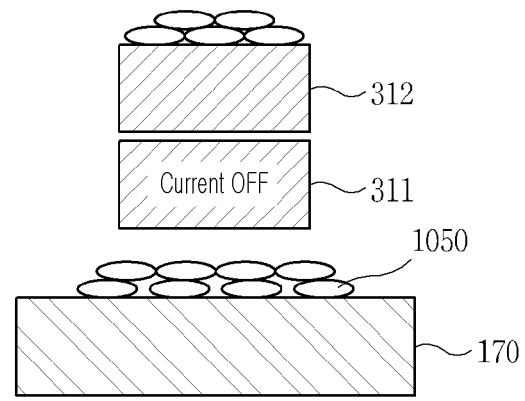
(a)
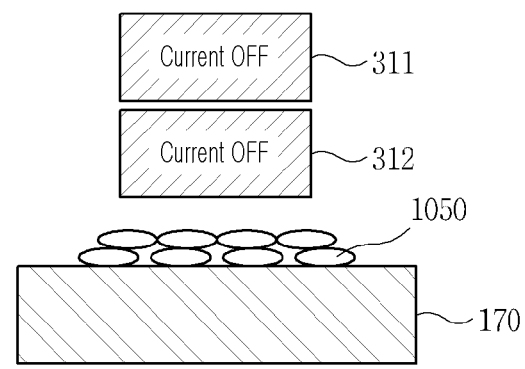
(b)

APPARATUS AND METHOD FOR COLLECTING SEMICONDUCTOR LIGHT EMITTING DIODES

CROSS-REFERENCE TO RELATED APPLICATIONS

This application is the National Stage filing under 35 U.S.C. 371 of International Application No. PCT/KR2019/011283, filed on Sep. 3, 2019, which claims the benefit of earlier filing date and right of priority to Korean Application No. 10-2019-0106060, filed on Aug. 28, 2019, the contents of which are all incorporated by reference herein in their entireties.

TECHNICAL FIELD

The present disclosure relates to a device for collecting semiconductor light emitting diodes for collecting semiconductor light emitting diodes remaining after assembly of the semiconductor light emitting diodes in manufacturing a display device using a semiconductor light emitting diodes having a size of several to several tens of μm, and a method for collecting semiconductor light emitting diodes using the same.

BACKGROUND ART

Recently, liquid crystal displays (LCD), organic light emitting diode (OLED) displays, and micro LED displays are competing to implement large-area displays in the display technology field.

However, in the case of LCD, there are problems such as slow response time and low efficiency of light generated by backlights, in the case of OLED, there are problems such as short lifespans, poor mass production yields, and low efficiency.

On the other hand, when a semiconductor light emitting diode (micro LED) having a diameter or cross-sectional area of 100 μm or less is used for a display, very high efficiency can be achieved because the display does not absorb light using a polarizing plate or the like. However, since a large display requires millions of semiconductor light emitting diodes, it is difficult to transfer the diodes compared to other technologies.

The technologies currently being developed for a transfer process may comprise pick & place technology, Laser Lift-off (LLO) technology, self-assembly technology or the like. Among them, the self-assembly technology is a method in which a semiconductor light emitting diode finds its own position in a fluid, and is the most advantageous method for realizing a large-screen display device.

Meanwhile, it is essential to reuse the semiconductor light emitting diodes remaining after self-assembly to reduce material costs when displays are manufactured using micro LEDs. In this case, in order to reuse more semiconductor light emitting diodes, loss or damage of the semiconductor light emitting diodes that may occur during the process should be minimized.

As a method for preventing the loss of the semiconductor light emitting diodes, there is a method of increasing the area of a tray for supplying the semiconductor light emitting diodes. However, there is a limit to manufacturing the tray area at the same or similar level to the display area, and even if the tray as above is manufactured, there is a problem that may interfere with the assembly process.

DISCLOSURE

Technical Problem

An object of the present disclosure is to provide a device for collecting semiconductor light emitting diodes capable of efficiently collecting the semiconductor light emitting diodes remaining in a chamber after self-assembly by forming a magnetic field on a surface of an electromagnet portion, and a method for collecting semiconductor light emitting diodes using the same.

Technical Solution

According to an embodiment of the present disclosure, a device for collecting semiconductor light emitting diodes comprises an electromagnet portion configured to be disposed in a fluid chamber into which semiconductor light emitting diodes comprising a magnetic material are put to form a magnetic field when power is applied, a power supply portion connected to the electromagnet portion and applying power to the electromagnet portion, and a driving portion configured to move the electromagnet portion in a width direction, in a longitudinal direction, and in a height direction of the fluid chamber, in which the electromagnet portion guides the semiconductor light emitting devices to a surface on which a magnetic field is formed when power is applied.

In this embodiment, the electromagnet portion comprises a first electromagnet disposed adjacent to a bottom surface of the fluid chamber, and a second electromagnet spaced apart from the first electromagnet by a predetermined interval in an arbitrary direction, and the first electromagnet and the second electromagnet operate independently.

In this embodiment, the first electromagnet and the second electromagnet have shapes which extend in one direction.

In this embodiment, an interval between the first electromagnet and the second electromagnet is variable by the driving portion.

In this embodiment, the second electromagnet is spaced apart from the first electromagnet by a predetermined interval upward.

In this embodiment, the driving portion rotates the first electromagnet and the second electromagnet about the extending directions of the first electromagnet and the second electromagnet as an axis so that the positions of the first electromagnet and the second electromagnet are changed from each other.

In this embodiment, the driving portion rotates the electromagnet portion about the width direction or the longitudinal direction of the fluid chamber as an axis.

According to an embodiment of the present disclosure, a method for collecting semiconductor light emitting diodes which is performed after the semiconductor light emitting diodes put into a fluid chamber are seated on the assembly board by using an electric field and a magnetic field, the method comprises disposing an electromagnet portion that forms a magnetic field when power is applied to be immersed in a fluid in the fluid chamber, applying power to the electromagnet portion, guiding the semiconductor light emitting diodes remaining in the fluid chamber to a surface of the electromagnet portion while moving the electromagnet portion in a width direction or a longitudinal direction of the fluid chamber, and collecting the semiconductor light emitting diodes guided to the surface of the electromagnet portion by cutting off the power applied to the electromagnet portion.

In this embodiment, the electromagnet portion is moved while rotating about the width direction or the longitudinal direction of the fluid chamber as an axis.

In this embodiment, the electromagnet portion comprises a first electromagnet disposed adjacent to a bottom surface of the fluid chamber, and a second electromagnet spaced apart from the first electromagnet by a predetermined distance in an arbitrary direction, and the first electromagnet and the second electromagnet operate independently.

In this embodiment, the second electromagnet is spaced apart from the first electromagnet by a predetermined interval upward.

In this embodiment, the first electromagnet collects the semiconductor light emitting diodes sunk to the bottom surface of the fluid chamber, and the second electromagnet collects the semiconductor light emitting diodes floating in the fluid chamber.

In this embodiment, the collecting the semiconductor light emitting diodes guided to the surface of the electromagnet portion comprises collecting the semiconductor light emitting diodes guided to the surface of the first electromagnet by cutting off the power applied to the first electromagnet, changing positions of the first electromagnet and the second electromagnet, and collecting the semiconductor light emitting diodes guided to the surface of the second electromagnet by cutting off the power applied to the second electromagnet.

Advantageous Effect

A device for collecting semiconductor light emitting diodes according to an embodiment of the present disclosure improves production efficiency by collecting the semiconductor light emitting diodes remaining in a fluid chamber after self-assembly by using an electromagnet and material cost reduction effect can be expected through reuse of the semiconductor light emitting diodes. In addition, it is easy to apply to the self-assembly device currently in use, and since the embodiment of the present disclosure uses an electromagnet, there is an advantage of being able to collect without damaging the semiconductor light emitting diodes.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8a to 8e are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIG. 10 is a view illustrating the configuration of a device for collecting semiconductor light emitting diodes according to the present disclosure.

FIG. 11 is a view illustrating the device for collecting semiconductor light emitting diodes according to an embodiment of the present disclosure.

FIGS. 12a and 12b are views illustrating the device for collecting semiconductor light emitting diodes (electromagnet portion comprising a plurality of electromagnets) according to another embodiment of the present disclosure.

FIG. 13 is a view illustrating a process of collecting semiconductor light emitting diodes gathered on a surface of an electromagnet portion using the device for collecting semiconductor light emitting diodes according to another embodiment of the present disclosure.

BEST MODE

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described in this specification may comprise a mobile phone, a smart phone, a laptop computer, a digital broadcasting terminal, a personal digital assistant (PDA), a portable multimedia player (PMP), a navigation system, and a slate PC, a tablet PC, an ultra book, a digital TV, a desktop computer and the like.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may comprise a panel 141 on which images are displayed, and the panel 141 may comprise a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights comprising blue.

The vertical semiconductor light emitting diode may comprise a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in a upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may comprise a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as a n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on the board of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductive semiconductor layer 153, an active layer 154, and a second conductive semiconductor layer 155 are individually grown on a growth substrate 159 (FIG. 5a).

After the first conductive semiconductor layer 153 is grown, the active layer 154 is grown on the first conductive semiconductor layer 153, and then the second conductive semiconductor layer 155 is grown on the active layer 154. In this way, when the first conductive semiconductor layer 153, the active layer 154, and the second conductive semiconductor layer 155 are sequentially grown, as shown in FIG. 5a, the first conductive semiconductor layer 153, the active layer 154 and the second conductive semiconductor layer 155 form a stacked structure.

In this case, the first conductive semiconductor layer 153 may be a p-type semiconductor layer, and the second conductive semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 1059 may be formed of a material suitable for semiconductor material growth, a carrier wafer. The growth substrate 159 may be formed of a material having excellent thermal conductivity, and may comprise a conductive board or an insulating board, for example, a SiC board having higher thermal conductivity than a sapphire (Al2O3) board, or use at least one of Si, GaAs, GaP, InP, and Ga2O3.

Next, at least a portion of the first conductive semiconductor layer 153, the active layer 154, and the second conductive semiconductor layer 155 are removed to form a plurality of semiconductor light emitting diodes (FIG. 5b).

More specifically, isolation is performed such that the plurality of light emitting diodes form a light emitting diode array. That is, the first conductive semiconductor layer 153, the active layer 154, and the second conductive semiconductor layer 155 are vertically etched to form a plurality of semiconductor light emitting diodes.

In the case of forming a horizontal type semiconductor light emitting diode, a mesa process in which the active layer 154 and the second conductive semiconductor layer 155 are partially removed in the vertical direction and the first conductive semiconductor layer 153 is exposed to the outside and thereafter, isolation in which the first conductive semiconductor layer is etched to form a plurality of semiconductor light emitting diode arrays may be performed.

Next, second conductive electrodes 156 (or p-type electrodes) are formed on one surface of the second conductive semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductive electrode 156 may be an n-type electrode.

Then, the growth substrate 159 is removed to provide a plurality of semiconductor light emitting diodes. For example, the growth substrate 1059 may be removed using a laser lift-off (LLO) method or a chemical lift-off (CLO) method (FIG. 5d).

Thereafter, the semiconductor light emitting diodes 150 are seated on a board in a chamber filled with a fluid (FIG. 5e).

For example, the semiconductor light emitting diodes 150 and the board are put in the chamber filled with a fluid, and the semiconductor light emitting diodes are self-assembled onto the board 1061 using flow, gravity, surface tension, and the like. In this case, the board may be an assembly board 161.

As another example, it is also possible to put the wiring board in a fluid chamber instead of the assembly board 161 so that the semiconductor light emitting diodes 150 are directly seated on the wiring board. In this case, the board may be the wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.'

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8a to 8d are conceptual views illustrating a process of self-assembling a semiconductor light emitting diode using the self-assembly apparatus of FIG. 6, and FIG. 9 is a conceptual diagram for describing the semiconductor light emitting diode of FIGS. 8a to 8d.

Referring to FIGS. 6 and 7, a self-assembly apparatus 160 of the present disclosure may comprise a fluid chamber 162, a magnet 163 and a position control unit 164.

The fluid chamber 162 has a space for accommodating a plurality of semiconductor light emitting diodes. The space may be filled with a fluid, and the fluid may comprise water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may comprise a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may comprise a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as $SiO_2$, $SiN_x$, $SiON$, $Al_2O_3$, $TiO_2$, $HfO_2$, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure comprises a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may comprise a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may comprise a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may comprise a magnetic material to move in the fluid due to the magnetic field of the magnet 163.

Referring to FIG. 9, a semiconductor light emitting diode comprising a magnetic material may comprise a first conductive electrode 1052, a second conductive electrode 1056, a first conductive semiconductor layer 1053 on which the first conductive electrode 1052 is disposed, a second conductive semiconductor layer 1055 on which the second conductive electrode 1056 is disposed, the second conductive semiconductor layer 1055 overlapping the first conductive semiconductor layer 1052 and an active layer 1054 disposed between the first and second conductive semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductive electrode 1052 may be generated after the semiconductor light emitting diode is assembled to the wiring board through self-assembly of the semiconductor light emitting diode. Also, in the present disclosure, the second conductive electrode 1056 may comprise the magnetic material. The magnetic material may mean a magnetic metal. The magnetic material may be Ni, SmCo, or the like, and as another example, may comprise a material corresponding to at least one of Gd-based, La-based, and Mn-based materials.

The magnetic material may be provided in the second conductive electrode 1056 in the form of particles. Alternatively, the conductive electrode comprising a magnetic material may have one layer formed of a magnetic material. For this example, as shown in FIG. 9, the second conductive electrode 1056 of the semiconductor light emitting diode 1050 may comprise a first layer 1056a and a second layer 1056b. Here, the first layer 1056a may comprise a magnetic material, and the second layer 1056b may comprise a metal material rather than a magnetic material.

As shown, in this example, the first layer 1056a comprising a magnetic material may be disposed to contact the second conductive semiconductor layer 1055. In this case, the first layer 1056a is disposed between the second layer 1056b and the second conductive semiconductor layer 1055. The second layer 1056b may be a contact metal connected to the second electrode of the wiring board. However, the present disclosure is not necessarily limited thereto, and the magnetic material may be disposed on one surface of the first conductive semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may comprise an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 comprising a magnetic material are formed through the process described with reference to FIGS. 5a to 5c. In this case, in the process of forming the second conductive electrode of FIG. 5c, a magnetic material may be deposited on the semiconductor light emitting diode.

Next, the board 161 is transferred to an assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8b).

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8c). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8c). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area board. Through this, it is possible to manufacture a large-area display device at a low cost.

Meanwhile, in order to commercialize the self-assembly method described above, a method for efficiently collecting the semiconductor light emitting diodes 1050 remaining in the chamber 162 after assembly and being capable of reusing the semiconductor light emitting diodes 1050 later must be prepared.

The present disclosure relates to a device for collecting a semiconductor light emitting diodes and a method for collecting a semiconductor light emitting diodes using the same and hereinafter, embodiments of the present disclosure will be described in detail with reference to the accompanying drawings.

FIG. 10 is a view illustrating the configuration of a device for collecting semiconductor light emitting diodes according to the present disclosure, FIG. 11 is a view illustrating the device for collecting semiconductor light emitting diodes according to an embodiment of the present disclosure, FIGS. 12*a* and 12*b* are views illustrating the device for collecting semiconductor light emitting diodes (electromagnet portion composed of a plurality of electromagnets) according to another embodiment of the present disclosure, and FIG. 13 is a view illustrating a process of collecting semiconductor light emitting diodes gathered on the surface of an electromagnet portion using the device for collecting semiconductor light emitting diodes according to another embodiment of the present disclosure.

The device for collecting semiconductor light emitting diodes 300 according to the present disclosure may comprise an electromagnet portion 310, a power supply portion 320, and a driving portion 330, and the power supply portion 320 and the driving portion 330 may be configured to operate the electromagnet portion 310.

The electromagnet portion 310 may be disposed in the fluid chamber 162 into which the semiconductor light emitting diodes 1050 comprising a magnetic material are put. For example, the degree of submersion of the electromagnet portion 310 is determined according to the level of the fluid (for example, DI water) contained in the fluid chamber 162 and accordingly, the electromagnet portion 310 may be disposed in the fluid chamber 162. Alternatively, the amount of fluid contained in the chamber 162 may be determined in consideration of the disposition of the electromagnet portion 310 for the process of collecting the semiconductor light emitting diodes 1050.

In addition, in an embodiment, the electromagnet portion 310 may comprise one or more electromagnets comprising a magnetic material that forms a magnetic field when power is applied and a coil surrounding the magnetic material, thereby forming a magnetic field when power is applied. Various embodiments related thereto will be described below.

The power supply portion 320 may be connected to the electromagnet portion 310 to apply power to the electromagnet portion 310. For example, the power supply portion 320 may be connected to the coil of the electromagnet portion 310 on both sides of the electromagnet portion 310 to supply current, and a magnetic field may be formed around the coil surrounding the magnetic material by the flow of the current. At this time, the influence of the magnetic field may extend to the surface of the electromagnet portion 310.

The driving portion 330 may move the electromagnet portion 310 in the width direction, in the longitudinal direction, and in the height direction of the fluid chamber 162. Here, the width direction, the longitudinal direction, and the height direction of the fluid chamber 162 may refer to x (or y), y (or x), and z-axis directions, respectively.

In addition, the driving portion 330 may move the electromagnet portion 310 in a state where power is applied. In other words, the electromagnet portion 310 may guide the remaining semiconductor light emitting diodes 1050 to the surface while moving in the fluid chamber 162 by the driving portion 330 in a state where a magnetic field is formed on the surface.

In addition, the driving portion 330 may move while rotating the electromagnet portion 310. For example, the driving portion 330 rotates the electromagnet portion 310 about a width direction or a longitudinal direction of the fluid chamber 162 (in detail, a direction substantially parallel to the width or longitudinal directions of the fluid chamber 162) as an axis. In a case where the electromagnet portion 310 is moved while rotating, the collection efficiency of the semiconductor light emitting diodes 1050 may increase.

In addition, when the electromagnet portion 310 comprises a plurality of electromagnets, the driving portion 330 may adjust an interval between the plurality of electromagnets.

Hereinafter, another embodiment of the electromagnet portion 310 will be described.

The electromagnet portion 310 may comprise a plurality of electromagnets that operate independently. For example, the electromagnet portion 310 may comprise a first electromagnet 311 disposed adjacent to the bottom surface of the fluid chamber 162 and a second electromagnet 311 disposed to be spaced apart from the first electromagnet 311 by a predetermined interval in an arbitrary direction, and the first electromagnet 311 and the second electromagnet 312 may operate independently. In other words, power may be independently applied to the first electromagnet 311 and the second electromagnet 312 and the first electromagnet 311 and the second electromagnet 312 may rotate and move in the same or different directions.

Referring to FIG. 12, the first electromagnet 311 and the second electromagnet 312 can be spaced apart from each other in the height direction of the fluid chamber 162 or spaced apart from each other in the longitudinal direction (or width direction) of the fluid chamber 162. In other words, at least one of the plurality of electromagnets constituting the electromagnet portion 310 may be disposed adjacent to the bottom surface of the fluid chamber 162 in which the remaining semiconductor light emitting diodes 1050 are most present.

However, considering the semiconductor light emitting diodes 1050 floating in the fluid, it may be most preferable that the second electromagnet 312 may be spaced apart from the first electromagnet 311 by a predetermined interval upward.

A plurality of electromagnets constituting the electromagnet portion 310, for example, the first electromagnet 311 and the second electromagnet 312 may be extended in one direction. Here, one direction may mean a width direction or a longitudinal direction of the fluid chamber 162.

Meanwhile, the interval between the first electromagnet 311 and the second electromagnet 312 may be changed by the driving portion 330. Specifically, the interval between the first electromagnet 311 and the second electromagnet 312 may be changed according to the disposition relationship of the first electromagnet 311 and the second electromagnet 312 or may be changed in the process of collecting the semiconductor light emitting diodes 1050.

In this regard, referring to FIGS. 12*a* and 12*b*, it can be confirmed that the interval between the first electromagnet 311 and the second electromagnet 312 in a state where the first electromagnet 311 and the second electromagnet 312 are disposed vertically (FIG. 12*a*) and the interval between the first electromagnet 311 and the second electromagnet 312 in a state where the first electromagnet 311 and the second electromagnet 312 are disposed horizontally (FIG. 12*b*) are different from each other.

First, in the former case, the collection process may be performed while the interval between the first electromagnet 311 and the second electromagnet 312 is maintained. In other words, the first electromagnet 311 and the second electromagnet 312 may move together in the same direction and speed to collect the semiconductor light emitting diodes 1050 remaining in the fluid chamber 162.

On the other hand, in the latter case, the first electromagnet 311 and the second electromagnet 312 may be disposed with the width or length of the fluid chamber 162 as an interval, and the collection process can be performed while the first electromagnet 311 and the second electromagnet 312 move in a direction to narrow the interval between the first electromagnet 311 and the second electromagnet 312.

Meanwhile, the semiconductor light emitting diodes 1050 gathered on the surface of the electromagnet portion 310 through the collection process may be separated from the surface of the electromagnet portion 310 as power supply to the electromagnet portion 310 is stopped. At this time, in the case of the electromagnet portion 310 comprising the first electromagnet 311 and the second electromagnet 312, the power supply may be sequentially stopped, and thus after the semiconductor light emitting diodes 1050 gathered in the first electromagnet 311 are collected, the semiconductor light emitting diodes 1050 gathered in the second electromagnet 312 may be collected.

For example, the semiconductor light emitting diodes 1050 gathered in the electromagnet portion 310 may be collected on a tray 170 that supplies the semiconductor light emitting diodes 1050 in the fluid chamber 162. For example, after the electromagnet portion 310 moves to the upper portion of the tray 170, the power supply is stopped, and the gathered semiconductor light emitting diodes 1050 may be collected on one surface of the tray 170.

At this time, in a case where the first electromagnet 311 and the second electromagnet 312 are disposed vertically as illustrated in FIG. 12a, the driving portion 330 may rotate the first electromagnet 311 and the second electromagnet 312 about the extension direction of the first electromagnet 311 and the second electromagnet 312 as an axis by 180° so that the positions of the first electromagnet 311 and the second electromagnet 312 are changed.

In other words, referring to FIG. 13, after collecting the semiconductor light emitting diodes 1050 gathered on the surface of the first electromagnet 311 disposed below on the tray 170, the positions of the first electromagnet 311 and the second electromagnet 312 are changed and thus the semiconductor light emitting diodes 1050 gathered on the surface of the second electromagnet 312 may be collected. Accordingly, it is possible to accurately and conveniently collect the semiconductor light emitting diodes 1050 gathered on the surface of the electromagnet 310.

On the other hand, in a case where the first electromagnet 311 and the second electromagnet 312 are horizontally disposed as illustrated in FIG. 12b, collection of the semiconductor light emitting diodes 1050 sequentially collected on each of the first electromagnet 311 and the second electromagnet 312 without changing the position between the first electromagnet 311 and the second electromagnet 312. For example, first, the first electromagnet 311 is disposed on the tray 170 to collect the semiconductor light emitting devices 1050 collected on the surface of the first electromagnet 311, the second electromagnet 312 is placed on the upper portion of the tray 170 on the upper portion, and then the same process can be repeated.

Meanwhile, when collecting the semiconductor light emitting diodes 1050 on the tray 170, the interval between the electromagnet portion 310 and the tray 170 can be minimized to prevent separation and diffusion of the semiconductor light emitting diodes 1050.

Since the device for collecting semiconductor light emitting diodes 300 described above is easy to apply to the self-assembly apparatus according to FIGS. 6 to 8 that is performed in the fluid chamber 162 and uses an electromagnet, there is an advantage that the semiconductor light emitting diodes 1050 can be collected without being not damaged.

Next, a method for collecting the semiconductor light emitting diodes 1050 using the device for collecting semiconductor light emitting diodes described above will be described.

The method for collecting semiconductor light emitting diodes according to the present disclosure relates to a collection process corresponding to a post-process of self-assembly and can be performed after the semiconductor light emitting diodes 1050 input into the fluid chamber 162 using an electric field and a magnetic field are seated on the assembly board 161.

According to an embodiment of the present disclosure, in order to collect the semiconductor light emitting diodes 1050 remaining in the fluid chamber 162 after self-assembly, first, a step of disposing an electromagnet portion 310 capable of forming a magnetic field when power is applied so as to be submerged in the fluid in the fluid chamber 162 may be performed. The electromagnet portion 310 may be disposed adjacent to the bottom surface of the fluid chamber 162, and a specific degree of submersion may be determined according to the level of the fluid contained in the fluid chamber 162.

Meanwhile, the electromagnet portion 310 may comprise one electromagnet or a plurality of electromagnets. For example, the electromagnet portion 310 may comprise a first electromagnet 311 disposed adjacent to the bottom surface of the fluid chamber 162 and a second electromagnet 311 disposed to be spaced apart from the first electromagnet 311 by a predetermined distance in an arbitrary direction, and the first electromagnet 311 and the second electromagnet 312 may operate independently.

According to a preferred embodiment of the present disclosure, the second electromagnet 312 may be spaced apart from the first electromagnet 311 by a predetermined interval upward. In this case, the first electromagnet 311 is to collect the semiconductor light emitting diodes 1050 sunk to the bottom surface of the fluid chamber 162, and the second electromagnet 312 is to collect the semiconductor light emitting diodes 1050 floating in the fluid chamber 162.

Next, the step of applying power to the electromagnet portion 310 may be performed. The electromagnet portion 310 may be connected to the power source portion to receive power, and a magnetic field may be formed on the surface when power is applied. In a case where the electromagnet portion 310 comprises the first electromagnet 311 and the second electromagnet 312, the first electromagnet 311 and the second electromagnet 312 are respectively connected to other power supply portions and power can be applied independently.

Next, a step of guiding the remaining semiconductor light emitting diodes 1050 remaining in the fluid chamber 162 to the surface of the electromagnet portion 310 while moving the electromagnet portion 310 in the width direction or the longitudinal direction of the fluid chamber 162 can be performed.

Since the semiconductor light emitting diodes 1050 used for self-assembly according to the present disclosure comprise a magnetic material, as power is applied to the electromagnet portion 310, the magnetic material is guided to a surface where a magnetic field is formed and thus can move together with the electromagnet portion 310.

For example, the electromagnet portion 310 may have a shape extending in either the width direction or the longitudinal direction of the fluid chamber 162, and in this case, while the electromagnet portion 310 moves in the longitudinal direction or in the width direction, the semiconductor light emitting diodes 1050 in the fluid chamber 162 may be collected.

In an embodiment, the electromagnet portion 310 extending in the width direction of the fluid chamber 162 may collect the semiconductor light emitting diodes 1050 while moving in the longitudinal direction of the fluid chamber 162, and the electromagnet portion 310 extending in the longitudinal direction of the fluid chamber 162 can collect the semiconductor light emitting diodes 1050 while moving in the width direction of the fluid chamber 162. According to this driving method, it is possible to efficiently collect the remaining semiconductor light emitting diodes 1050 in the fluid chamber 162 while minimizing the movement path of the electromagnet portion 310.

In addition, in order to improve the semiconductor light emitting diodes 1050 collection efficiency, the electromagnet portion 310 may be moved while rotating about the width direction or the longitudinal direction of the fluid chamber 162 as an axis.

In addition, in a case where the electromagnet portion 310 comprises the first electromagnet 311 and the second electromagnet 312, the first electromagnet 311 and the second electromagnet 312 may be driven independently. For example, the first electromagnet 311 and the second electromagnet 312 may move in the same direction or move in different directions according to the disposition relationship to collect the semiconductor light emitting diodes 1050. As described above, in a case where the first electromagnet 311 and the second electromagnet 312 are disposed in the vertical direction, the semiconductor light emitting diodes 1050 may be collected while the respective electromagnets move in the same direction.

Finally, the step of cutting off the power applied to the electromagnet portion 310 to collect the semiconductor light emitting diodes 1050 guided on the surface of the electromagnet portion 310 may be performed. The semiconductor light emitting diodes 1050 guided on the surface of the electromagnet portion 310 by the magnetic field may be separated from the surface of the electromagnet portion 310 as the power supply is stopped and the magnetic field is extinguished.

The semiconductor light emitting diodes 1050 separated from the surface of the electromagnet portion 310 may be collected on one surface of the tray 170 provided in the fluid chamber 162 to supply the semiconductor light emitting diodes 1050 during self-assembly.

Meanwhile, in a case where the electromagnet portion 310 comprises the first electromagnet 311 and the second electromagnet 312, the step of collecting the semiconductor light emitting diodes 1050 guided to the surface of the electromagnet portion 310 may comprise a step of collecting the semiconductor light emitting diodes 1500 guided on the surface of the first electromagnet 311 by cutting off the power applied to the first electromagnet 311, a step of changing the positions of the first electromagnet 311 and the second electromagnet 312 and a step of collecting the semiconductor light emitting diodes 1050 guided on the surface of the second electromagnet 312 by cutting off the power applied to the second electromagnet 312.

Specifically, the first electromagnet 311 and the second electromagnet 312 in a state where power is applied may be moved to the upper portion of the tray 170. At this time, the electromagnet portion 310 may be moved to the upper portion of the tray 170 so that the first electromagnet 311 faces one surface of the tray 170 from which the semiconductor light emitting diodes 1050 are to be collected, and the interval between the first electromagnet 311 and the tray 170 may be disposed to be minimized while not in contact with each other. In this process, the movement of the electromagnet portion 310 may comprise movement of the fluid chamber 162 in the height direction (z-axis).

Next, by stopping the application of power to the first electromagnet 311, the semiconductor light emitting diodes 1050 gathered on the surface of the first electromagnet 311 by the magnetic field may be separated from the surface of the first electromagnet 311. The separated semiconductor light emitting diodes 1050 may be collected on one surface of the tray 170, and the interval between the first electromagnet 311 and the tray 170 is narrowed so that the semiconductor light emitting diodes 1050 can be prevented from escaping to the periphery of the tray 170 during the separation process. In addition, at this time, power application to the second electromagnet 312 may be continuously performed.

Next, the positions of the first electromagnet 311 and the second electromagnet 312 may be changed from each other. In other words, the step of disposing the second electromagnet 312 to face the upper portion of the tray 170 may be performed. For example, in a case where the first electromagnet 311 and the second electromagnet 312 are extended in one direction, the first electromagnet 311 and the second electromagnet 312 can be rotated 180° about the extending direction as an axis, and the second electromagnet 312 may still be in a state in which power is being applied.

Next, the semiconductor light emitting diodes 1050 gathered on the surface of the second electromagnet 312 may be collected on the tray 170 by cutting off the power applied to the second electromagnet 312.

The method for collecting semiconductor light emitting diodes described above can efficiently remove the semiconductor light emitting diodes 1050 remaining in the fluid chamber 162 at once, and thus there are effects that improving production efficiency and reducing material cost through reuse of the semiconductor light emitting diodes 1050.

The present disclosure described above is not limited to the configuration and method of the embodiments described above, but the embodiments may be configured by selectively combining all or part of each embodiment so that various modifications can be made.

The invention claimed is:

1. A device for collecting semiconductor light emitting diodes, the device comprising:
at least one electromagnet disposed in a fluid chamber into which the semiconductor light emitting diodes are put, the at least one electromagnet comprising a magnetic material configured to form a magnetic field when power is applied;
a power supply coupled to the at least one electromagnet and configured to apply power to the at least one electromagnet; and
a driver configured to move the at least one electromagnet along one or more of a width direction, a longitudinal direction, or a height direction of the fluid chamber,
wherein the at least one electromagnet is configured to guide the semiconductor light emitting devices to a surface at which the magnetic field is formed when power is applied,
wherein the at least one electromagnet comprises:

a first electromagnet disposed adjacent to a bottom surface of the fluid chamber; and
a second electromagnet spaced apart from the first electromagnet by an interval, and
wherein the first electromagnet and the second electromagnet are configured to operate independently.

2. The device of claim 1,
wherein the interval between the first electromagnet and the second electromagnet is variable by the driver.

3. The device of claim 1,
wherein the first electromagnet and the second electromagnet have shapes which extend along a first direction.

4. The device of claim 3,
wherein the second electromagnet is spaced apart from the first electromagnet by the interval along the height direction of the fluid chamber.

5. The device of claim 4,
wherein the driver is further configured to rotate the first electromagnet and the second electromagnet about an axis parallel to the first direction so that positions of the first electromagnet and the second electromagnet are changed relative to each other.

6. The device of claim 1,
wherein the driver is further configured to rotate the at least one electromagnet about an axis parallel to the width direction or the longitudinal direction of the fluid chamber.

7. A method for collecting semiconductor light emitting diodes in a fluid chamber, the method comprising:
disposing at least one electromagnet to be immersed in a fluid in the fluid chamber, the at least one electromagnet configured to form a magnetic field when power is applied;
applying power to the at least one electromagnet;
guiding the semiconductor light emitting diodes in the fluid chamber to a surface of the at least one electromagnet while moving the at least one electromagnet along a width direction or a longitudinal direction of the fluid chamber; and
collecting the semiconductor light emitting diodes guided to the surface of the at least one electromagnet by cutting off the power applied to the at least one electromagnet,
wherein the at least one electromagnet comprises:
a first electromagnet disposed adjacent to a bottom surface of the fluid chamber; and
a second electromagnet spaced apart from the first electromagnet by an interval, and
wherein the first electromagnet and the second electromagnet are configured to operate independently.

8. The method of claim 7,
wherein the at least one electromagnet is moved while being rotated about an axis parallel to the width direction or the longitudinal direction of the fluid chamber.

9. The method of claim 7,
wherein the second electromagnet is spaced apart from the first electromagnet by the interval along a height direction of the fluid chamber.

10. The method of claim 9,
wherein the first electromagnet is configured to collect semiconductor light emitting diodes sunk to the bottom surface of the fluid chamber, and
wherein the second electromagnet is configured to collect semiconductor light emitting diodes floating in the fluid chamber.

11. The method of claim 7,
wherein collecting the semiconductor light emitting diodes guided to the surface of the at least one electromagnet comprises:
collecting semiconductor light emitting diodes guided to a surface of the first electromagnet by cutting off power applied to the first electromagnet;
changing positions of the first electromagnet and the second electromagnet relative to each other; and
collecting semiconductor light emitting diodes guided to a surface of the second electromagnet by cutting off power applied to the second electromagnet.

* * * * *